US008440981B2

(12) United States Patent
Bromberg et al.

(10) Patent No.: US 8,440,981 B2
(45) Date of Patent: May 14, 2013

(54) COMPACT PYROELECTRIC SEALED ELECTRON BEAM

(75) Inventors: Leslie Bromberg, Sharon, MA (US); Ching Wu, Acton, MA (US)

(73) Assignee: Excellims Corporation, Acton, MA (US)

( * ) Notice: Subject to any disclaimer, the term of this patent is extended or adjusted under 35 U.S.C. 154(b) by 147 days.

(21) Appl. No.: 13/159,304

(22) Filed: Jun. 13, 2011

(65) Prior Publication Data

US 2011/0260075 A1 Oct. 27, 2011

Related U.S. Application Data

(63) Continuation-in-part of application No. 12/251,995, filed on Oct. 15, 2008, now Pat. No. 7,960,704.

(60) Provisional application No. 60/980,115, filed on Oct. 15, 2007.

(51) Int. Cl.
*H01J 37/06* (2006.01)
*H01J 29/08* (2006.01)

(52) U.S. Cl.
USPC .................... 250/427; 250/432 R; 250/493.1; 250/455.11; 313/14; 315/111.81; 378/122

(58) Field of Classification Search .................. 250/427, 250/432 R, 493.1, 455.11; 313/14; 315/111.81; 378/122
See application file for complete search history.

(56) References Cited

U.S. PATENT DOCUMENTS

| | | | | |
|---|---|---|---|---|
| 3,840,748 | A | 10/1974 | Braunlich | |
| 4,468,282 | A | 8/1984 | Neukermans | |
| 5,176,557 | A | 1/1993 | Okunuki | |
| 5,962,995 | A | 10/1999 | Avnery | |
| 5,969,349 | A | 10/1999 | Budovich | |
| 6,319,430 | B1 * | 11/2001 | Bordui et al. | 252/584 |
| 6,429,426 | B1 | 8/2002 | Doring | |

(Continued)

FOREIGN PATENT DOCUMENTS

WO WO2006060030 A2 6/2006

OTHER PUBLICATIONS

Mansingh The AC Conductivity and Dielectric Constant of Lithium Niobate Single Crystals J. Phys. D. Appl. Phys. 16, 1985. 2059-2071.

(Continued)

*Primary Examiner* — Nikita Wells

(57) ABSTRACT

A non-radioactive source for Atmospheric Pressure Ionization is described. The electron-beam sealed tube uses a pyroelectric crystal(s). One end of the crystal is grounded while the other end has a metallic cap with sharp feature to generate an electron beam of a given energy. The rate of heating and/or cooling of the crystal is used to control the current generated from a tube. A heating and/or cooling element such as a Peltier element is useful for controlling the rate of cooling of the crystal. A thin window that is transparent to electrons but impervious to gases is needed in order to prolong the life of the tube and allow the extraction of the electrons. If needed, multiple crystals with independent heaters can be used to provide continuous operation of the device. Dielectric shielding of the pyroelectric crystal is used to minimize discharge of the crystal.

13 Claims, 7 Drawing Sheets

U.S. PATENT DOCUMENTS

| | | | | |
|---|---|---|---|---|
| 6,586,729 | B2 | 7/2003 | Doring | |
| 6,661,876 | B2 | 12/2003 | Turner | |
| 6,790,788 | B2 | 9/2004 | Li | |
| 7,035,379 | B2 | 4/2006 | Turner | |
| 7,105,808 | B2 | 9/2006 | Bromberg | |
| 7,233,647 | B2 | 6/2007 | Turner | |
| 7,266,178 | B2 | 9/2007 | Grodzins | |
| 7,558,373 | B2 | 7/2009 | Nakanishi | |
| 7,741,615 | B2 | 6/2010 | Putterman | |
| 7,960,704 | B2 * | 6/2011 | Bromberg et al. ............ | 250/424 |

OTHER PUBLICATIONS

Spyrou Why Paschien's Law does not apply in Low-pressure gas Discharges with Inhomogenous Fields J. Phys. D. Aapl. Phys. 28, 1995, 701-710.

Geuther Electron and Positive Ion Acceleration with Pyroelectric Crystals Journal of Applied Physics 97, 2005, 074109.

Bayssie Generation of Focused Electron Beam and Xrays by the Doped LiNbO3 Crystals Nuclear Instruments and Methods in Physics Research B 241, 2005, 913-916.

* cited by examiner (A)

(B)

(C)

COMPACT PYROELECTRIC SEALED ELECTRON BEAM

CROSS-REFERENCE TO RELATED APPLICATIONS

The present application is a continuation in part of U.S. patent application Ser. No. 12/251,995, filed on Oct. 15, 2008, and claims the benefit of and priority to corresponding U.S. Provisional Patent Application No. 60/980,115, filed Oct. 15, 2007 respectively, the entire content of these applications are herein incorporated by reference.

BACKGROUND OF THE INVENTION

Atmospheric Pressure Ionization is used in analytical instruments, such as Atmospheric Pressure Chemical Ionization (APCI) Mass Spectrometry, and in detection devices. The detection devices can be either conventional Ion Mobility Spectrometers (IMS) or Differential Mobility Spectrometers (FAIMS). These devices typically use a small radioactive source that generates energetic particles (electrons, alpha particles) that when introduced into the surrounding gas ionize some atoms or molecules.

There have been attempts to replace the radioactive source commonly used in APCI. There are corona discharges, uv-ionization, laser induced ionization, and other plasma discharges. However, these sources have drawbacks and lack the flexibility of an ionization source which launches energetic particles into the gas.

Electron beams are used commercially for treatment of surfaces and gases. These electron beam units have a large evacuated volume, with a thermionic cathode, usually at high voltage facing a thin anode-window at ground, that allows transmission of the beam, usually in a triode configuration. The current is adjusted by either appropriate heating of the cathode, or through appropriate biasing of the controlling the intermediate voltage, while the electron energy is determined by the voltage drop from the cathode to the anode. These units required a continuous vacuum in order to prevent breakdown that could destroy the thin window. In addition, the high voltage at the cathode requires high-voltage feedthroughs that are large.

Compact electron beams have been contemplated as an ionization source for APCI. In the patent literature, Vitaly Budovich (U.S. Pat. No. 5,969,349, October 1999) teaches the use of an electron beam as the ionization source. The source has a window, preferably mica, and an evacuated volume with a hot cathode or a photocathode. Hans-Rudiger Donzig (U.S. Pat. No. 6,429,426, August 2002) teaches the use of an electron beam source used to make x-rays. In this case, the electrons do not have to be extracted from the evacuated volume. More recently, Hans-Rudiger Donzig (U.S. Pat. No. 6,586,729, July 2003), teaches the use of a current controlled e-beam for the control of x-ray emission, using a sustainer (in a triode configuration). This patent also teaches a scheme for monitoring the pressure in the tube and evacuating the tube when the pressure is too high.

These patents, and in particular U.S. Pat. No. 5,969,349, teach an electron source with a cathode with a high voltage feedthrough. This high potential is needed for acceleration of the electrons using conventional acceleration technology. However, conventional technologies present issues with the size of DC power supplies (including the transformer), the size of the high voltage insulators and other issues dealing with high voltage such as arcing. Alternatives to the high voltage requirement for high energy electron beams could result in significantly more robust and compact devices.

U.S. Pat. No. 7,105,808, Plasma ion mobility spectrometer, describes a compact electron beams that does not require a high voltage feedthrough, but still requires active voltage control. The electron beams concepts in this patent use an internal step-up transformer or a microwave electromagnetic fields in a cavity, the electromagnetic field matching the electron cyclotron resonance an externally imposed steady magnetic field. The electron current in these concepts is difficult to control and the devices are complex and large.

The use of pyroelectric crystals has been suggested for the generation of electron and ion beams. See, for example, *Generation of focused electron beam and X-rays by the doped $LiNbO_3$ crystal*, M. Bayssie, J. D. Brownridge, N. Kukhtarev, T. Kukhtarev, J. C. Wang, *Nuclear Instruments and Methods in Physics Research B* 241 (2005) 913-916, and *Electron and positive ion acceleration with pyroelectric crystals*, Jeffrey A. Geuther and Yaron Danon, *Journal Of Applied Physics* 97, 074109 (2005) However, it is difficult to control the voltage or the current of the device. Stable voltage and adjustable current would be useful in applications of electron beam ionization for APCI devices.

The present state of the art of pyroelectric electron beams lacks adequate current control, lacks continuous production, has relatively low currents, has problems with thermal conductivity which can result in crystal cracking, the window needs to be able to withstand high temperatures, discharge of the crystal needs to be minimized, thus making them unsuitable for applications for an Ion Mobility Spectrometer. In addition, means of achieving a sealed tube with long lifetime and with sufficient stability has not been proposed to date. It is the purpose of this invention to overcome these obstacles.

SUMMARY OF THE INVENTION

A non-radioactive source for Atmospheric Pressure Ionization is described. The electron-beam sealed tube uses pyroelectric crystal(s). One end of the crystal is grounded while the other has a metallic end with a sharp feature to generate an electron beam of a given energy. The rate of heating or cooling of the crystal is used to control the current generated from a tube. A heating and/or cooling element such as a Peltier element is useful for controlling the rate of cooling of the crystal. A thin window that is transparent to electrons but impervious to gases is needed in order to prolong the life of the tube and allow the extraction of the electrons. The window is also grounded. If needed, multiple crystals with independent heaters can be used to provide continuous operation of the device. The energy of the electrons can be determined through appropriate choice of the radius of curvature of the sharp feature and the gap between the sharp feature and the window, while the opposite side of the crystal is at low voltage. The size of the gap and the radius of curvature of the sharp feature are determined by the filling gas nature, the pressure, and by the desired electron beam energy.

BRIEF DESCRIPTION OF THE DRAWINGS

The foregoing and other aspects, embodiments, and features of the inventions can be more fully understood from the following description in conjunction with the accompanying drawings. In the drawings like reference characters generally refer to like features and structural elements throughout the various figures. The drawings are not necessarily to scale, emphasis instead being placed upon illustrating the principles of the inventions.

DETAILED DESCRIPTION OF VARIOUS EMBODIMENTS

This electron beam generator invention using a pyroelectric crystal(s) can be used as a non-radioactive ionization source in any analytical instrument whereby a non-radioactive ionization source is necessary. For example, the electron beam ionization source and method is intended to be used in a similar fashion to a radioactive source such as Ni63.

The phrase "and/or," as used herein in the specification and in the claims, should be understood to mean "either or both" of the elements so conjoined, i.e., elements that are conjunctively present in some cases and disjunctively present in other cases.

Unless otherwise specified in this document the term "ion mobility based detector" is intended to mean any device that separates ions based on their ion mobilities and/or mobility differences under the same or different physical and/or chemical conditions, the spectrometer may also include detecting the ions after the separation process. Many embodiments herein use the time of flight type IMS as examples; the term ion mobility based detector shall also include many other kinds of spectrometers, such as differential mobility spectrometer (DMS) and field asymmetric ion mobility spectrometer (FAIMS). Unless otherwise specified, the term ion mobility spectrometer or IMS is used interchangeable with the term ion mobility based detector defined above.

One aspect of the invention is a non-radioactive ionization method that produces high energy electrons in a sealed tube separated from a atmospheric or near atmospheric pressure gas by cooling and/or heating a pyroelectric crystal, which extracts the high energy electrons through a thin window that is transparent to the emitted electrons but impervious to gases, and accelerates internally the high energy electrons to a device without the use of externally generated accelerating voltages.

Figure 7:
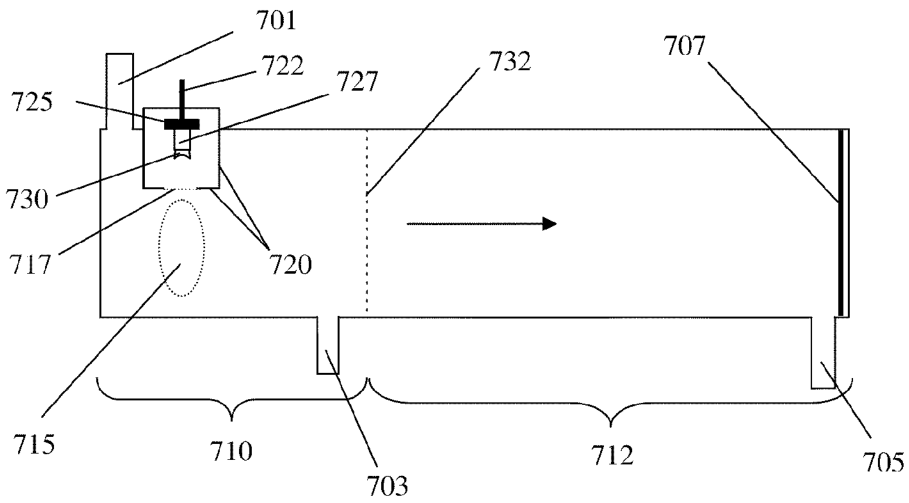
FIG. 7 shows the sealed ebeam tube being used in an ion mobility based detector.

A non-limiting example of an electron beam sealed tube that has a pyroelectric crystal 727 being used as a non-radioactive ionization source in an ion mobility based detector is shown in FIG. 7. The drift chamber 712 is separated from the reaction chamber 710 with a shutter/gate grid 732 and may also include an ion preconcentrator (not shown) around the shutter/gate grid 732. A detector 707 is located at the end of the drift chamber 710 near the drift gas inlet 705. The reaction chamber has a sample port 701 and 703 that could be used either as sample inlet or gas outlet depending on operational needs. The sealed electron beam generator is located within the reaction chamber 710 and ionizes at least some of the sample molecules as they pass the ionization region 715 and/or reaction chamber 710. The electron beam is generated from a pyroelectric crystal 727 that may or may not have a metallic cap 730 and is heated by a heating source 725. The heating source 725, metallic cap 730 and pyroelectric crystal 727 are all sealed from the external gas with sealed tube walls 720 and a thin window 717 where the electrons are emitted. The current leads 722 are attached to the heating source 725 through the sealed tube wall 720. In one embodiment of this non-limiting example at least one sealed tube wall 720 and the thin window 717 separates the reaction chamber 710 from the sealed tube.

Figure 8:
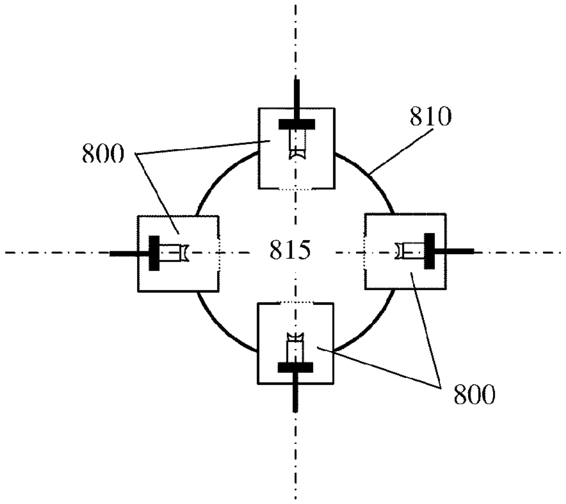
FIG. 8 shows the side view of an ion mobility based detector that consists of more than one ionization source.

In one alternative embodiment, more than one ionization source can be used for the same spectrometer. FIG. 8 shows a side view of an ion mobility based detector similar to the one shown in FIG. 7. In this non-limiting case, four ionization sources 800 are place inside the spectrometer wall 810 and surrounded the ionization region 815 where primary ions are formed. The ionization source and method is intended to be used in a fashion similar to a radioactive source, such as Ni63. A non-limiting example of replacing the Ni63 radioactive source would be to have the thin window 717 of the e-beam ionization source in the same location of the instrument as the Ni63's surface where ionization occurs. In this case the e-beam ionization source would replace the Ni63 source with no or minimal instrument modification. The Ni63 source could be switched out for a e-beam source when a non-radioactive ionization source would be needed. In a variety of operational modes, multiple ionization sources can be used either in parallel or sequential. In parallel mode, each ionization source in the multiple ionization source configurations generates ions simultaneously. In sequential mode, each ionization source in the multiple ionization source configuration generates ions one after another; in this case, a constant ion current could be maintained.

Figure 9:
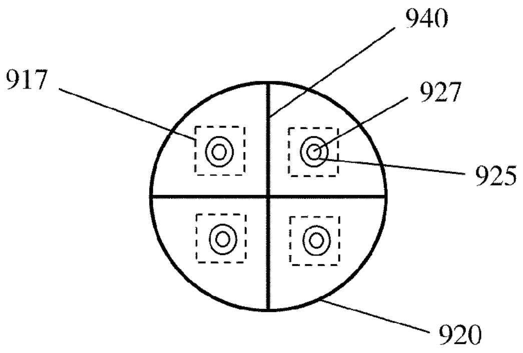
FIG. 9 shows one ionization source that contains multiple sections, each section may function as an independent ionization source.

In an alternative embodiment, one ionization source may contain multiple pyroelectric crystals that are isolated from each other. Each section (compartment) of the multiple section ionization source could be operated independently, either in parallel or sequentially. A non-limiting example is shown in FIG. 9 where internal walls 940 electrically isolate the four pyroelectric crystals 927. A sealed external wall 920 contains the internal walls 940 and the contents of the ionization sections of the ionization source. In this non-limiting example, the four compartments include all the necessary parts; pyroelectric crystals 927, heating sources 925, thin windows 917, etc. for each individual section. In some cases the thin window could be one piece for the entire ionization source, which covers at least a portion of each compartment (not shown).

Figure 1:
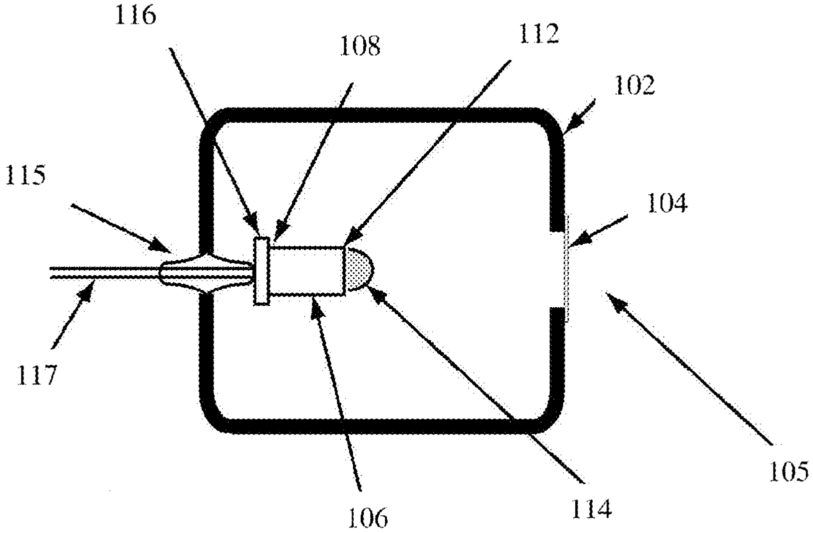
FIG. 1 shows a schematic diagram of a sealed electron beam tube using Peltier elements.

One aspect of the invention is the component layout used to generate the non-radioactive electron beam. FIG. 1 shows a sealed tube electron beam 102 with a very thin window 104 through which electrons are extracted. The region between the fast electrons and the atmospheric pressure gas takes place in interaction region 105. The sealed tube beam 102 is evacuated, and the window prevents the gas external to the sealed tube from leaking into said tube. The tube has a pyroelectric crystal 106 of length L and area A, with a material with a dielectric constant c. During electron emission, the end of the crystal nearer to thin window 104 is negative, and thus this end is referred to as cathode end of the crystal 112, although there are no external voltages applied to it. It should be pointed out that the polarization of the crystal could be that of the opposite polarity (thus, anodic), but with enough surface charges that the external electric field is that of a cathode. The end of the crystal 108 furthest from thin window 104 is attached to the inner side of the sealed tube 110 and during electron emission is defined as the anode. The cathode end of the crystal 112 (defined as the one which either during cooling or heating emits electrons) is attached to a metallic cap 114. The anode end of the crystal 108 is thermally attached to a heating source 116, which could be a resistor (for heating) or a Peltier element (for heating and cooling). In one embodiment where the resistive element is inside the vacuum tube, the current leads 117 for heating and/or cooling element 116 are introduced into the evacuated region of sealed tube 102 through feedthrough 115. The feedthrough 115 is a low voltage low current feedthrough, much simpler than the high voltage feedthroughs required for carrying the high voltage in conventional electron beams. Conductive heating methods can also be implemented using thermally conductive dielectric materials, such as AlN and/or electrically conductive materials with significant insulation.

The metallic cap can be joined/attached to the body of the crystal by using a number of different methods. One non-limiting example is using planarization techniques where both surfaces are very flat and jointed through molecular forces. Alternatively, the metallic cap can be jointed/attached to the body of the crystal by using a thermally and/or electrical conducting epoxy.

The pyroelectric crystal can be heated from the outside of the tube without direct contact to the crystal with a heat source. The use of either dielectric heating or induction can be used. In the case of induction heating, a set of loops located outside of the pyroelectric crystal, unconnected to each other, can be used to generate heat that is then transferred uniformly along the surface of the pyroelectric crystal. In the case of dielectric heating, a non-conducting material can be placed surrounding the pyroelectric crystal. This material can be heated by RF generated outside of the tube, for example, in the case of glass (or other dielectric) enclosures.

In the case where the heating or heating and/or cooling element is inside the vacuum, one side of the heating element can be connected to the outer wall in order to provide additional cooling. Alternatively, the heating element can be placed thermally insulated from the feedthrough, and thus cooling of the crystal is only through radiation and thermal conduction through the current leads and the ambient gas. In the case of the Pelltier element, it is necessary to have one of the sides of the Pelltier element in good thermal contact with the walls. The heating or the heating and/or cooling element can be attached to the crystal in the same manner as the metallic cap, through planarization or through the use of thermal/electrical conducting epoxies or other acceptable method.

In an embodiment of the invention, the pyroelectric crystal can be operated in such a way that the voltage at the end with the cap 114 is at high positive voltage when the tube is warmed up, or at high negative voltage when it is warmed up. The cap can be either metallic (and in this case, equipotential) or it can be an integral part of the pyroelectric device, for the purpose of eliminating field concentration at the rim of the cylindrically shaped pyroelectric crystal. In the first case, the electrons will be emitted during the warm up phase, while in the later the electrons will be emitted during the cooling down phase. Thus, although the voltage will reverse during the non-electron emitting time, the nomenclature used for the polarity of the different elements, and in particular the cathode is the element that emits electrons. As pointed above, emission can occur when the polarization of the crystal is such that the cathode is positive (thus anodic), but there is enough charge on the surface or the metallic cap to result in a high negative potential.

In another embodiment of the invention, the thermal time constant of lithium niobate pyroelectric crystals is on the order of 5 seconds (for a 5 mm long crystal). The energy required to heat the crystal to operating temperature is on the order of 30 J. Thus, the required heating power is on the order of 6 W during the heating. For controlled cooling with the Peltier element, substantially larger powers are required. A good number of other pyroelectric materials also exist, including but not limited to lithium tantanate, triglycerine sulfate, barium titanate. For application for electron beam, materials with relatively high thermal conductivity are preferred. Materials with high coercive field are desired, and single crystal congruent lithium niobate is among the best.

The temperature decay is not uniform, but approximately decays either exponentially (if the heat flow of the crystal is due to conduction) or to $\sim 1/t^{1/4}$ if the heat flow is due to radiation. After sustained heating, charge accumulation on the end of the crystal balance the voltage induced by the pyroelectricity. Charge accumulation as well as polarization of the crystal dominate the electrical performance of the crystal. The electron emitting process will be briefly described assuming that the polarization is such that the free surface becomes positive during warm up. During the warm up process, the large positive charge at the free end results in microdischarges resulting in the deposition of electrons on the surface. Once the crystal begins to cool, the process reverses, and the high potential due to the electronic charge in the pyroelectric crystal surface results in vacuum gap breakdown or emission of electrons (in the case of field emission as described by the Fowler-Nordheim equation). The electrons are either in the surface of the crystal or distributed throughout the crystal through small and/or by finite conductivity. In the case when the end of crystal 112 is the cathode during cooling, because of the non-uniform decay of temperature, the current (which is related by the rate of change of temperature) varies substantially during the cooldown.

The process of electron emission and charge transfer is complicated by the very high electrical resistivity of the pyroelectric material. For example, $LiNbO_3$ at a temperature of 500 K has an electrical conductivity of about 10−9/Ohm m [A Mansingh et al, *The AC conductivity and dielectric constant of lithium niobate single crystals, J. Phys. D: Appl. Phys.* 18 2059-2071 (1985)], with a very strong temperature dependence. If the electric field is 100 kV in a 5 mm long rod, the electrical current in a 5 mm diameter rod is about 400 nA, much higher than what it is expected that the device provides. Thus, under these conditions, it is likely that the pyroelectric crystal partially discharges through conduction across the media and what would be surface charges would be partially distributed through the volume. A plurality of surface charges are eliminated through heating of the heating and/or cooling element to temperatures that result in substantial conduction through the pyroelectric crystal. The temperature of charge elimination may be in the range of 100-150° C., but could also fall outside of this temperature range. At lower temperatures, the electrical conductivity decreases very fast, and electron motion through the lithium niobate becomes much reduced. Lithium niobate devices operate at temperatures below approximately 80° C. Discharging of the tube through finite conductivity may be one of the reasons why the device only operates at the lower temperatures.

In the case of heating with polarity such that the end of the crystal 112 is charged negatively during the charging, it is possible to control the current through the rate of heating. However, care must be observed in heating rate, in order to uniformly heat the pyroelectric element (which takes on the order 15 s for a 10 mm long crystal).

The electron emission can take multiple characteristics. The electron emission is due to field emission, in which case the electrons emitted from the cathode reach the window with the full voltage, which is high. The device discharges enough charge so that the field emission stops, and does not begin until the field becomes high enough for field emission to occur. Alternatively, the fields can be such that the gas in the electrode-window gap breaks down. In this case, although some electrons will have high energy, most will be relatively low energy, as the electric field to maintain the discharge is small, and most of the electrons are generated in this manner. A third process could occur, where the electrons emitted from the cathode multiply in a swarm fashion, generating secondary electrons that when arriving to the window will have reduced energies compared to the electrons emitted by the cathode. For the present device, the field emission is the preferred method, and design of the cathode tip, filling gas pressure and composition and tip-window distance can be adjusted in order to provide electrons with a given energy, as the breakdown phenomena/field emission dominates the discharge of the crystal.

Figure 2:
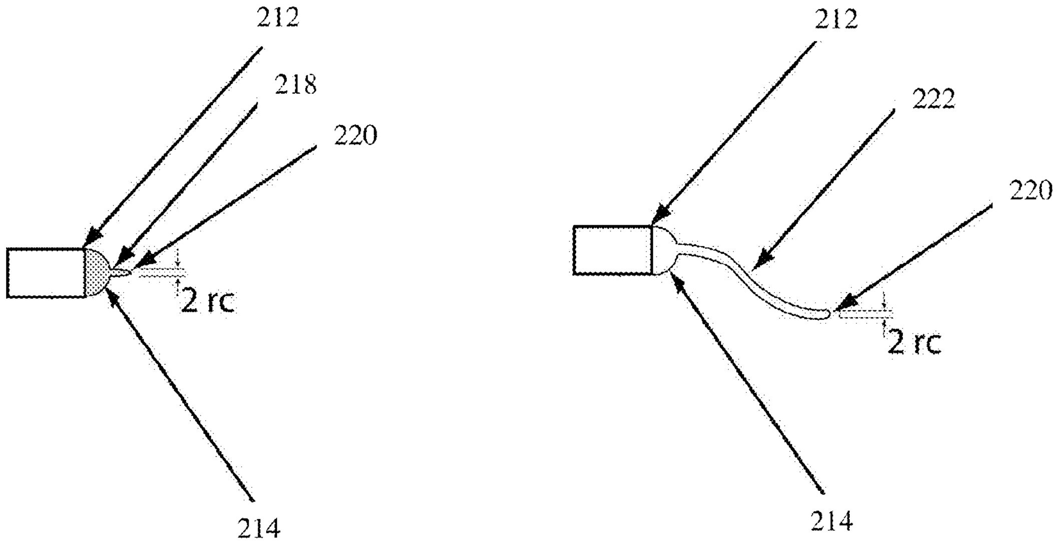
FIG. 2 shows a schematic diagram of two embodiments for the metallic sharp feature at the high voltage end of the crystal.

FIG. 2 shows the metallic cap 214 that is located at the cathode end of the pyroelectric crystal 212. The metallic cap 214 has a sharp feature 218 with a tip 220 that has a radius of curvature rc. The metallic cap has an axial sharp feature. The sharp feature 218 can be remotely located from the metallic cap 214 through metallic connection 222.

One aspect of the invention involves the heating time. The heating time can be minimized by making the electrode shorter, so that the heating takes place in faster time frame, and by making metallic cap 214 small with a relatively long metallic connection 222. Thus, by making it 5 mm long instead of 10 mm, the characteristic time is decreased by a factor of 4, to about 4 s. Even shorter times can be achieved for quick analysis using even shorter rods.

However, the maximum electric field achieved is decreased. The electric field that is induced in good pyroelectric materials, such as $LiNbO_3$, is about 1 MV/cm/K. Clearly, breakdown and neutralization of the surfaces occurs at much lower values of electric field. Assuming that the maximum voltage scales $V_{MAX}$~α L with the length of the rod L, the charge capability of the rod Q, given by the ratio between the voltage and the capacitance of the rod C~A ∈/L where A is the cross sectional area of the rod, e is the dielectric constant of the pyroelectric material (~30). The charge capability of the rod, for a given cross sectional area, during half-a cycle (warm-up or cool-down, is thus Q~CV~α A ∈ independent on the length of the rod. The total charges (Coulombs) during the half—cycle can be adjusted by appropriate choice of the area A of the crystal.

One aspect of the invention as a non-limiting example has a cathode end of the pyroelectric crystal shaped to produce a high electric field in a feature on the cathode surface to serve as the preferential electron emitting region, such that the feature is substantially smaller than the pyroelectric crystal cross section. The cathode end of the pyroelectric crystal can have an axial sharp feature.

Certain embodiments of the present invention relate to vacuum gaps. The voltage of the emitted electrons, as described in this invention, is determined by the breakdown voltage of the vacuum gap. Vacuum gaps have been studied extensively in the past. The invention relies in that as the voltage of the end of the crystal or the emitting corner increases as the unit cools down or warms up, a microdischarge occurs when the voltage exceeds a given value. It is called a microdischarge because the discharge is self limiting, that is, after it starts, accumulation of positive polarity in the tip of the cathode decreases the value of the electric field, until finally the microdischarge is extinguished. After further change in temperature, the electric field increases to the point where the voltage is again the breakdown voltage, and the vacuum gap breaks down again, and the process repeats. Thus, electron emission is through many microdischarges, each with a charge emission that is proportional to the capacitance of the rod. The time for the partial discharge of the crystal top depends on the instantaneous current and the capacitance of the dielectric rod.

The electrons are emitted in a set of repetitive pulses, as indicated by the overlap of pulses when the units are used for x-ray production, where pulse overlap is read as increased energy. Using the information from Danon et al., it is possible to determine that the on-off time is about $10^{-3}$, thus if the pulses occur at around 1 MHz, the on-time of the electron emissions is about 1 ns. The fast pulsing does not affect the nature of the ionization, as the time constant for the density in the APCI device is on the order of 1 ms.

Typical numbers, at 75° C., with α~1.3 $10^7$ V/cm, the maximum polarization charge is about 200 nC, and the current, if emitted during 30 s, is about 6 nA. This is relatively a large current, as the equivalent energetic electron current from a 20 mCu$^{63}$Ni source (typical of atmospheric pressure chemical ionization devices) is about 10 pA. The capacitance is on the order of a few picofarads. Thus the ionization strength in the API device can be 3 orders of magnitude higher, resulting in ~30 times the ion currents (because of recombination, ion densities scale as the square root of the ionization strength).

Another aspect of the invention is generally directed to extracting the ions from the sealed tube. In order to extract the ions from the vacuum, a thin vacuum window is needed. Energy losses through the vacuum window depend on the initial energy of the ions, and at initial electron energy 60-100 keV the energy lost in the window can amount to 10's of keV (depending on the thickness and material of the window). Minimization of the window thickness is important, while at the same time assuring that the vacuum integrity is not compromised. Low Z materials degrade the electron energy less than high Z materials. Multiple window materials can be used. However, the preferred embodiment uses a thin beryllium window with a set of coatings, in order to minimize gas leakage. Manufacturing of these windows is difficult because of gas permeation through the membranes, which to begin with are not pin-hole free. In the preferred embodiment, thin windows with an inorganic coating are preferred, as described, for example, in U.S. Pat. Nos. 7,233,647 and 7,035,379. Although coatings using boron hydride, silicon carbide, silicon nitride boron nitride and boron carbide are mentioned, others, such as aluminum with a thin alumina layer, as described in Larin [Larin, M. P., *Fabrication, measurement, and applications of surfaces with low emittances at low temperatures, Soviet Physics—Technical Physics,* 28, n 5, May 1983, 570-8], could be also be used.

In yet another aspect of the invention, permeation of the tube of gases in the metal of the walls of the device that do not constitute the window may also need to be provided with a coating, if nothing else to prevent permeation of hydrogen, present at low concentration in ambient air, but that diffuse readily in most metals. The coating on the non-window walls can be provided on the outside or on the inside of the device. Very low leakage rates have been achieved in this manner, with measured leak rates lower than $10^{-10}$ mbar liter/s. With these provisions, the devices will be sealed so tightly that would last for many years without large increase in pressure.

Another aspect of the invention is using a brazed window, metallic with an insulating layer, with bare metal facing the crystal, and a non-conducting coating on the outside. Generally the tube assembly 102 needs to be air-tight, therefore the window 104 attachment to the other walls of the tube needs to have a seal to prevent leakage into the tube. When the tube is operated at temperatures >200 C, brazing can be utilized for making the seal. Brazing is typically used as a metal joining process whereby a filler metal is heated above and distributed between two or more close-fitting parts by capillary action. The process is similar to soldering, except the temperatures used to melt the filler metal is above 450 C. The coating can only handle 400-500 C, and thus the window and its assembly cannot brazed to the glass. This means that the vacuum tube needs to be made from metal, or the window is brazed to a metal piece that is then fused to the glass. The process of making the window entails the base and crystal assembled together. One method is to apply a dielectric coating on the surface of the metal assembly facing the vacuum, in order to minimize electron current away from the window. The thin window that is transparent to the emitted electrons but impervious to gases is then brazed on the metal assembly, under vacuum conditions. Alternatively, the glass enclosure is fused to the metallic window holder. Then the crystal is inserted into the tube. The thin window that is transparent to the emitted electrons but impervious to gases is then glued to the brazed window holder, with the un-coated side facing the crystal and the dielectric coating facing towards the outside of the tube. The dielectric coating on the glass enclosure and/or the thin window can be made from a number of low-z elements, such as but not limited to: boron hydride, silicon carbide, silicon nitride boron nitride, boron carbide, and aluminum with a thin alumina layer. Hybrid composites can also be considered, with two or more layers Another aspect of the invention is to minimize thermal gradient along the crystal which can result in large stresses and crystal cracking. The crystal can be shunted using high thermal conductivity materials, such as sapphire, epitaxial diamond, MN or other suitable materials, such as polished dielectrics, but not limited to these. They are glued or dry attached to the pyroelectric crystal.

Still in another aspect of the invention, it may be desirable to coat the pyroelectric crystal with this gas impervious coating. Not only does this minimize the outgassing, but it also allows for some control of the surface condition of the crystal, and in particular to help control surface flashover.

In some embodiments of the invention, surface flashover can also be decreased by making an hour-glass shape pyroelectric crystal 632, increasing the path between the high voltage and the low voltage extremes of the cylinder, without increasing the cylinder height. Other shapes that help prevent surface flashover are conical or ridged cylindrical structures, as shown in FIG. 6.

Figure 6:
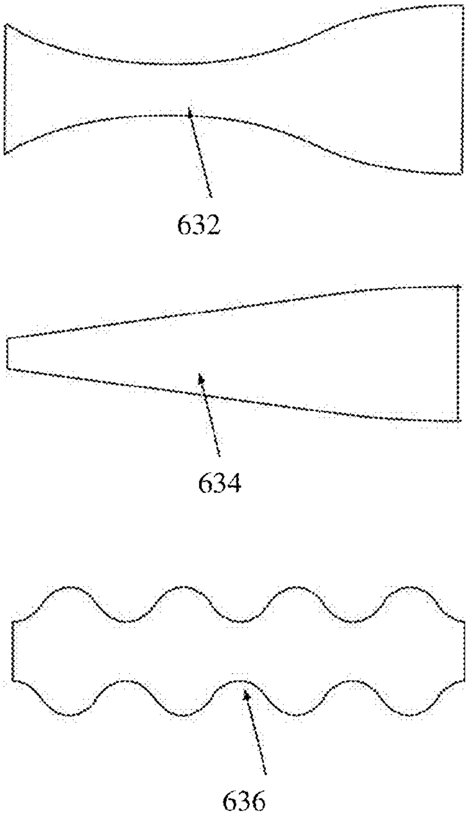
FIG. 6 shows different shapes of the pyroelectric crystal to minimize surface flashover.

FIG. 6 shows some non-limiting examples of the pyroelectric crystal that can be used to minimize surface flashover. The first one shown in FIG. 6 indicates a pyroelectric crystal 632 with an hourglass shape that increase the path for the surface flashover. The pyroelectric crystal 634 has a conical shape, while pyroelectric crystal 636 has a ridged structure.

In some embodiments of the invention mentioned above, vacuum gap breakdown is not sensitive to pressure under a few times $10^{-5}$ Torr. At higher pressure, the breakdown voltage of the vacuum gap actually increases, before decreasing at pressures on the order of $10^{-3}$ Torr, depending on the gas. The electron beam device of the present invention can be evacuated to low pressures and then filled with a desirable gas before being permanently sealed. The purpose of the gas fill could be to maintain the conditioning of the cathode, in order to maintain surface quality needed for vacuum gap breakdown voltage stability. The gas fill can be noble gases such as, but not limited to (He, Ar) or molecular gases such as, but not limited to $N_2$, $O_2$, $CO_2$, $H_2$, or $SF_6$. These gases can be at many pressures, in particular pressures from 0.5 mtorr to 4 mtorr. Not only does the gas help charge-neutralize the crystal, it can also be used to cool the crystal through thermal conduction. Helium and hydrogen are gases with high thermal conductivity.

Figure 5:
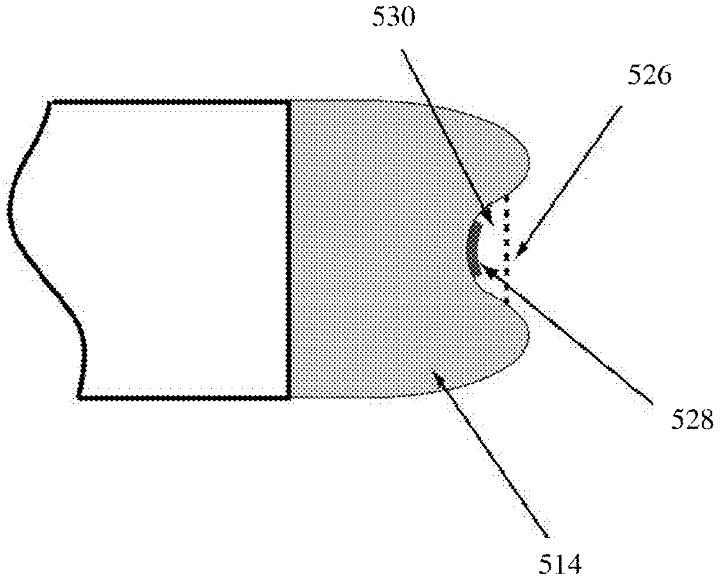
FIG. 5 shows a manner to reduce the electric field at the cathode.

Multiple surface materials, as well as shapes of the electron emitting cathode can be considered for this invention. Recently developed carbon nanotubes experience very high stability with the ability of generating very high currents and extremely high current densities. Currents as high as 2 microA have been extracted from an individual single-wall carbon nanotube which can be very stable. The problem is that the turn-on current of the carbon nanotube cathodes is a few hundred Volts. In order for their use in the invention, substantial electric field shielding is required, about 3 orders of magnitude. In conventional electron tubes, the shielding is provided by the existence of a triode configuration, which allows external control of the control grid. It is possible to get this level of shielding passively by the use of shielding grids. Because of the small distances involved, grids with very small grid spacing would be needed, while to minimize electron beam loses, highly transparent grids would be needed. FIG. 5 shows schematically a shielding grid in front of the cathode on a concave metallic cap 514. The electric field penetrates through the grid which then decays exponentially, with an exponent that is related to the wire spacing in the grid. The exponential decay can be used to reduce the applied electric field at the location of the surface where the cathode end of the pyroelectric crystal is a single or a plurality of nanotubes. Other possibilities for relatively low turn-on voltage cathodes include sharp tips, such as tungsten tip shaped using electrolytic process. It should be noted that in the case of nanotubes the process is not so much breakdown of the vacuum gap, as large amount of electron production through field emission. This process follows the Folwer-Nordheim relation, which also shows a very high dependence of current on voltage, and thus can be considered a turn-on voltage.

FIG. 5 shows an embodiment that uses a cathode 528 with a low voltage turn on, located behind shielding grid 526, which reduces the electric field at the location of the cathode 530. By choosing the wire-to-wire distance in the mesh appropriately it is possible to select a given ratio between the value of the electric field at the location of the cathode to that of the electric field at the location of the grid. Note that if the grid is solid or with very small wire-to-wire spacing, the value of the electric field at the cathode is very close to 0.

Alternatively, the choice of the tip radius rc at the metallic cap as shown in FIG. 2 can be used to determine the value of the electric field (and thus the voltage) at breakdown of the vacuum gap. The radius of curvature rc of the electrode tip, as well as the vacuum gap distance between the tip and anode can be chosen so that the electron energy at conditions of breakdown (i.e., the breakdown voltage) are appropriate for the application. It is necessary that the breakdown voltage be smaller than the voltage associated with surface flashover.

The presence of a sharp point locates the generation of the electron emission. This allows for control of the electron distribution at the window, and thus the size of the required window. It is thus possible to optimize the system, including the electron window size, the cathode/anode gap, the size of the crystal (length and diameter), and the size of the heating and/or cooling element.

The high electric field around the region of the sharp features 218 as shown in FIG. 2 results in a vacuum gap breakdown in the sealed tube 102 as shown in FIG. 1. Because of the non-uniform nature of the electric field, care must be taken so that the breakdown occurs at the region of the sharp feature, as opposed to the sides of the rod. It has been noticed that breakdown at pressure lower than about 1 Torr [N Spyrou, R Peyrous, N Soulem and B Held, *Why Paschen's law does not apply in low-pressure gas discharges with inhomogeneous fields, J. Phys. D: Appl. Phys.* 28 (1995) 701-710] the discharges are no longer axial from the sharp feature, but rather radial. This situation is remedied by the absence of a high voltage feedthrough and by the use of high vacuum.

In another set of embodiments, multiple pyroelectrirc crystals can be used in the tube. They can have different characteristics, such as, but not-limited to length. Longer units can be used to provide increased current or voltage, while smaller units can be used to produce faster response of the crystal, depending on the application.

Figure 3:
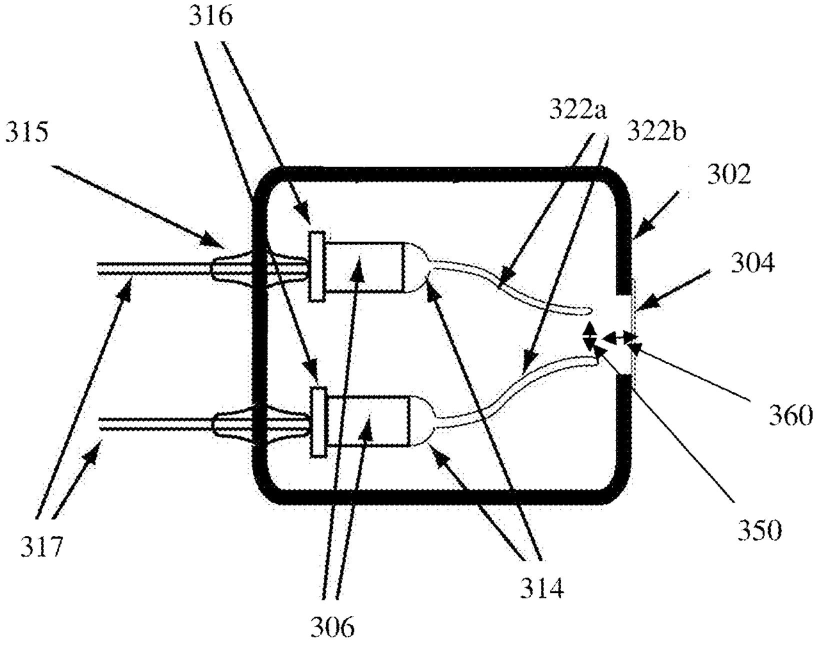
FIG. 3 shows a schematic diagram of a sealed tube with multiple crystals and heaters, with sharp features of different radii.

FIG. 3 shows a apparatus diagram of a sealed tube 302 with two pyroelectric crystals 306, each connected to a metallic connection 322*a*, 322*b*, located so that the distance 350 between each of the ends of the metallic connections are separated more than the gap 360 between each metallic connection 322*a*, 322*b* and the thin window 304. In addition, the apparatus may include but is not limited to; two current leads 317, two feedthoughs 315, two heating and/or cooling elements 316, and two metallic caps 314. A plurality of pyroelectric crystals may be used that may be the same or different in size, shape, and/or composition.

Figure 4:
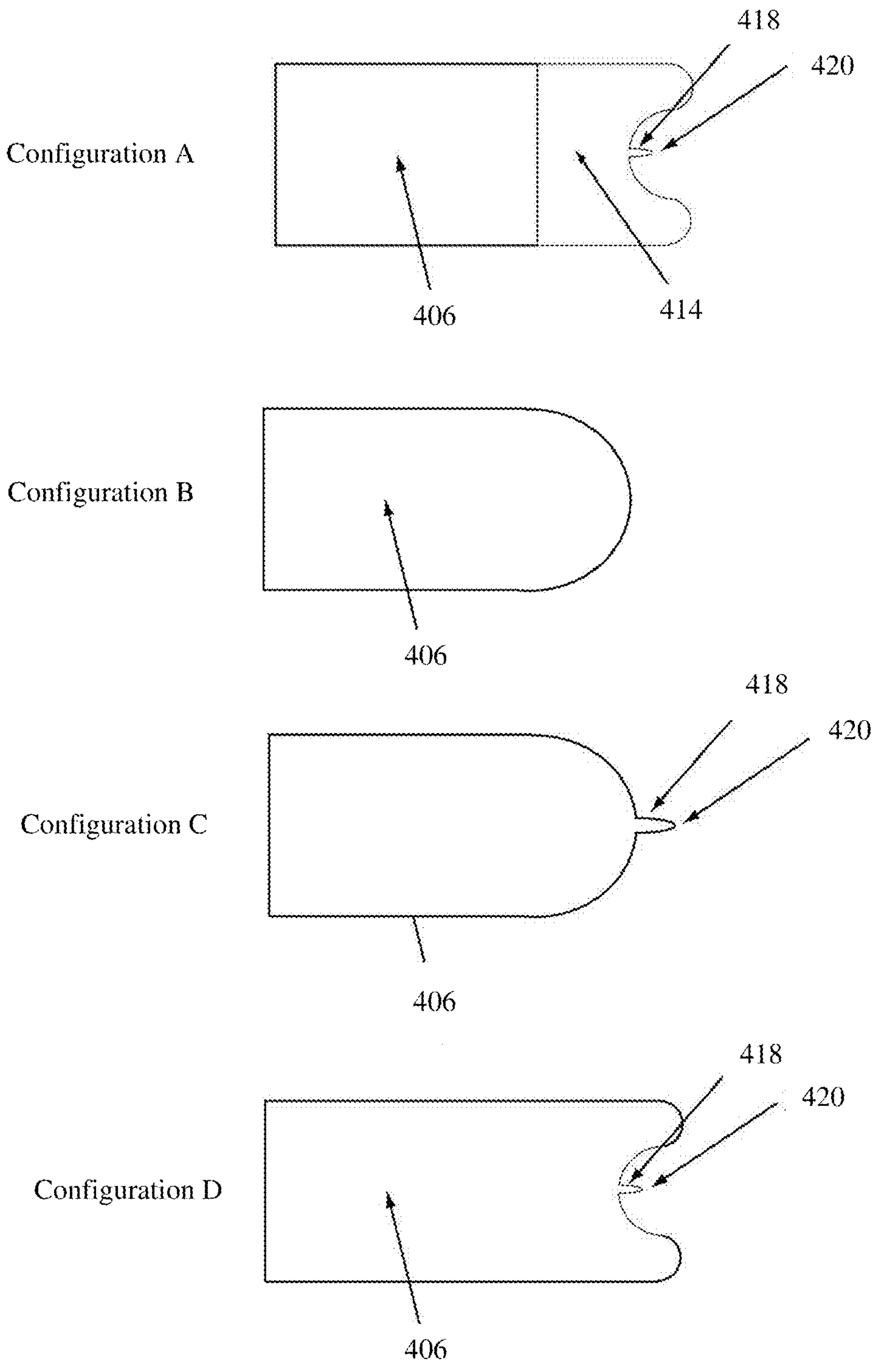
FIG. 4 shows various embodiments of the cathode end of the crystal.

Another aspect of the invention is generally directed to the shape of the crystal and/or metallic cap. The following embodiments and/or examples are non-limiting. The metallic cap 414 can be shaped to produce more uniform fields, in order to assure that the discharge is axial, as shown in FIG. 4. In addition to shaping the metallic cap, it is desirable to shape crystal 406 at the cathode end of the crystal. In one embodiment the crystal itself is shaped to provide an increase in voltage in the region axis of the crystal, as shown in FIG. 4, configuration B. In another embodiment, the central region of the pyroelectric crystal 406 at the cathode end of the crystal can be curved to provide a region of relatively uniform field in the center, configuration D, also assisting in the generation of centrally located discharges. In this embodiment, the axial region can be produced by adequate polishing of the crystal, or by the addition of a metallic cap 414, as shown in FIG. 4, configuration A. The metallic cap 414 is in a concave shape for configuration A.

FIG. 4 shows several embodiments of the cathode end. In addition to the metallic cap 214 shown in FIG. 2, it is possible to shape the metallic cap to increase the length of the region with high field, to minimize the possibility of radial/side discharges. Also shown is the possibility of shaping the pyroelectric crystal itself, first conically or concave, as shown in configuration D, with a high field generation in the central region, or convex, as in configuration B that generated a region of relatively uniform electric field. A sharp feature 418 may be placed on the axis of the shaped end 420, as shown in configurations A, C, & D.

Figure 10:
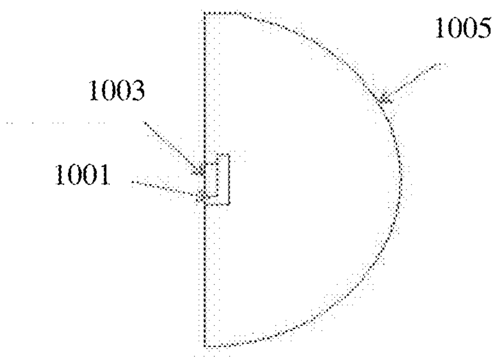
FIG. 10 shows a shaped dielectric material surrounding the pyroelectric crystal.
Figure 11:
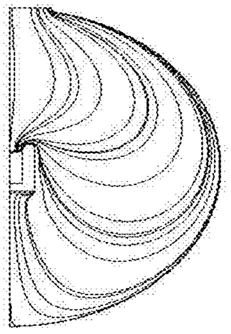
FIG. 11 shows three field diagrams (A, B, and C) for the configuration used in FIG. 10.
Figure 11:
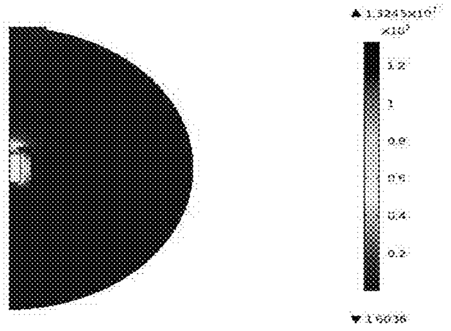
Figure 11:
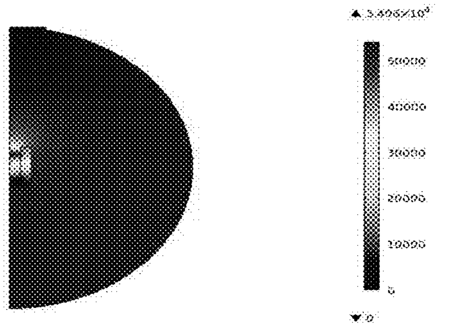

Another embodiment of the invention uses dielectric shielding of the pyroelectric crystal to minimize discharge of the crystal. A global breakdown in the gap between the crystal and the window or the tube can result in lower energy electrons which is less desirable for various applications, and would reduce the applied electric field across the gap by providing neutralization of the charges on the crystal. Surface breakdown (electrons originated from the surface of the crystal, not from the breakdown of gas in the gap), would be an improvement. Operating at low gas pressure to minimize gas breakdown is desirable. Surface inhomogeneities (at the cathode) is also desired to allow for surface breakdown. Minimizing the gap breakdown also minimizes the creation of high-energy positive ions that can damage the surface of the cathode. These high-energy ions, if they are hydrogen and with an energy of 100 keV, penetrate into the crystal a distance of about 10 microns. They will produce substantial damage of the crystal, the radiation about 10000 rads/s, or about 100,000 seconds before there is substantial damage to the crystal (assumed to occur at a radiation of 1.e9 rads). It is best if the crystal has a thin metallic coverage with larger radiation resistance than the crystal. The distance between the crystal and the window is important. Lower distances can be used to minimize the electron loss to regions away from the window. However, larger distances are useful in that the electron avalanches from the crystal occur at higher voltages, and thus the electrons have appropriate energy. The distance between the crystal and the window is set by the prevention of the electron avalanche at low electron energies (that is, by adjusting the electric field at the surface of the crystal). In order to decrease the rate of temperature change when cooling, the crystal is made by surrounding it with a dielectric material that has substantial thermal mass while at the same time prevent electrons from striking regions of tube where there is no window. The electrons that strike the surfaces away from the window are wasted. By shaping dielectrics around the region surrounding the pyroelectric crystal, it is possible to minimize this loss making the present invention more efficient (higher current). FIG. 10 shows Teflon 1001 being used with a dielectric constant of 2 with lithium niobate 1003 which shows a zero charge field 1005. FIG. 11 shows three different field diagrams that correspond to the configuration of FIG. 10: (A) streamline electric field, (B) Surface electric field norm (V/m), and (C) Surface electric potential (V).

It is recognized that modifications and variations of the invention disclosed herein will occur to those of ordinary skill in the art and it is intended that all such modifications and variations be included within the scope of the appended claims. The contents of all of the patents and literature articles cited herein are incorporated into this specification by reference.

What is claimed is:

1. A non-radioactive ionization apparatus for ionizing at least some of the sample molecules, comprising:

a sealed tube which separates at least one pyroelectric crystal from the sample molecules to be ionized:

a heat source which heats the pyroelectric crystal from outside the sealed tube without direct contact to the pyroelectric crystal; and a thin window that is transparent to the emitted electrons but impervious to gases.

2. The non-radioactive ionization apparatus of claim 1, wherein the heat source provides induction heating.

3. The non-radioactive ionization apparatus of claim 2, wherein induction heating is provided by a set of loops located outside of the pyroelectric crystal.

4. The non-radioactive ionization apparatus of claim 1, wherein the heat source uses dielectric heating.

5. The non-radioactive ionization apparatus of claim 4, wherein dielectric heating is provided by placing a non-conductive material surrounding the pyroelectric crystal.

6. The non-radioactive ionization apparatus of claim 5, wherein the non-conductive material is heated by RF generated outside of the sealed tube.

7. A non-radioactive ionization apparatus for ionizing at least some of the sample molecules, comprising:

a sealed tube which separates at least one pyroelectric crystal from the sample molecules to be ionized:

a high thermal conductivity material is shunted to the pyroelectric crystal in order to minimize the thermal gradient along the pyroelectric crystal; and a thin window that is transparent to the emitted electrons but impervious to gases.

8. The non-radioactive ionization apparatus of claim 7, wherein the high thermal conductivity material is: sapphire, epitaxial diamond, AlN, polished dielectrics, but not limited these.

9. A non-radioactive ionization apparatus for ionizing at least some of the sample molecules, comprising:

a sealed tube which separates at least one pyroelectric crystal from the sample molecules to be ionized;

a thin window that is transparent to the emitted electrons but impervious to gases; and a dielectric material is placed around the pyroelectric crystal in order to decrease the rate of temperature change when cooling and to prevent electrons from striking regions of the tube without the thin window.

10. The non-radioactive ionization apparatus of claim 9, wherein the dielectric material is Teflon.

11. A non-radioactive ionization apparatus for ionizing at least some of the sample molecules, comprising:

a sealed tube which separates at least one pyroelectric crystal from the sample molecules to be ionized; and a brazed window that is: metallic with an insulating layer, bare metal facing the pyroelectric crystal, transparent to the emitted electrons but impervious to gases, and has a non-conducting coating on the outside.

12. The non-radioactive ionization apparatus of claim 11, wherein the sealed tube is made from metal.

13. The non-radioactive ionization apparatus of claim 11, wherein the sealed tube has a dielectric coating towards the outside.

* * * * *